United States Patent [19]
Cardinale

[11] Patent Number: 6,015,640
[45] Date of Patent: Jan. 18, 2000

[54] MASK FABRICATION PROCESS

[75] Inventor: Gregory F. Cardinale, Oakland, Calif.

[73] Assignee: EUV LLC, Santa Clara, Calif.

[21] Appl. No.: 09/048,870

[22] Filed: Mar. 26, 1998

[51] Int. Cl.⁷ .................................................. G03F 9/00
[52] U.S. Cl. .................................................. 430/5
[58] Field of Search .................................................. 430/5

[56] References Cited

U.S. PATENT DOCUMENTS

| | | | |
|---|---|---|---|
| 5,304,437 | 4/1994 | Tennant | 430/5 |
| 5,521,031 | 5/1996 | Tennant et al. | 430/5 |

OTHER PUBLICATIONS

D. M. Tennant et al., "Reflective Mask Technologies and Imaging Results in Soft X–ray Projection Lithography", J. Vac. Sci. Technol., B9, 3176, 3183, 1991.

A. M. Hawryluk et al., "Applications of Microfabrication Technology to X–ray Laser Cavities", J. Vac. Sci. Technol., B6, 2153, 2157, 1988.

A. M. Hawryluk et al., "Reflection Mask Technology for X–ray Projection Lithography", J. Vac. Sci. Technol., B7, 1702, 1704, 1969.

*Primary Examiner*—Christopher G. Young
*Attorney, Agent, or Firm*—Donald A. Nissen

[57] ABSTRACT

A method for fabricating masks and reticles useful for projection lithography systems. An absorber layer is conventionally patterned using a pattern and etch process. Following the step of patterning, the entire surface of the remaining top patterning photoresist layer as well as that portion of an underlying protective photoresist layer where absorber material has been etched away is exposed to UV radiation. The UV-exposed regions of the protective photoresist layer and the top patterning photoresist layer are then removed by solution development, thereby eliminating the need for an oxygen plasma etch and strip and chances for damaging the surface of the substrate or coatings.

8 Claims, 2 Drawing Sheets

MASK FABRICATION PROCESS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

CROSS-REFERENCE TO RELATED APPLICATIONS

Not applicable.

BACKGROUND OF THE INVENTION

This invention relates generally to a process for fabricating masks or reticles having excellent surface cleanliness and integrity and more particularly to reticles or masks useful for printing images with extreme ultraviolet radiation.

Integrated circuits are presently manufactured using lithographic processes. By transmitting light through a patterned mask the light interacts selectively with an energy sensitive photoresist material deposited onto a substrate in such a way that a pattern or image is produced on the resist material. The resist material is developed and the pattern is transferred by etching onto the substrate by processes well known in the semiconductor art.

However, as integrated circuits have become smaller demands to achieve submicron resolution with sufficient line width control on a substrate have become increasingly important. Design rules of 0.5 $\mu$m are being replaced by design rules that require feature sizes of 0.25 to 0.18 $\mu$m and significant effort is presently being put into achieving 0.1 $\mu$m resolution. As the feature size decreases, the wavelength of light required for submicron resolution decreases (for a design rule of 0.1 $\mu$m light with a wavelength of about 13 to 15 $\mu$m is preferred) with a corresponding increase in the photon energy. At these shorter wavelengths the light is strongly attenuated by a conventional transmission mask and thus projection methods using masks that reflect rather than transmit light become necessary.

Reflecting masks for extreme ultraviolet (EUV) or soft x-ray projection lithography, i.e., light whose wavelength is in the range 3.5–15 nm, are conventionally fabricated by depositing a reflective multilayer coating onto a substrate and patterning an absorber layer thereon. It should be noted that the term "reticle" is used to describe a mask having a pattern disposed thereon whose magnification is larger than that to be defined on the substrate. Typical geometry reductions range between four and ten times, the reticle features being greater than the actual printed image. Feature reduction allows complex circuitry to be imaged from the relatively large size reticles that are easier to make than masks having submicron features and makes mask defects easier to repair. Hereinafter the terms "mask" and "reticle" will be used interchangeably.

The multilayer coating used to reflect EUV can be composed of alternating layers of Mo and Si or Mo and Be deposited onto a polished silicon or quartz substrate. Various schemes for patterning the reflective multilayer coating have been reported, such as removal of selected areas of the reflective multilayer coating itself to form a surface having both absorbing and reflecting areas and depositing and patterning an overlaying absorber layer. In the latter case, rather than the conventional dry etching step, liftoff patterning can be used to limit damage to the underlying surface of the reflective multilayer coating. However, there are problems associated with this process such as generation of defects due to debris left on the reflective coating.

An alternative approach to fabricating masks has been disclosed in U.S. Pat. No. 5,304,437. Here a protective or barrier layer that can be silicon dioxide or an organic polymeric material such as a photoresist material can be deposited onto the multilayer coating to protect the surface of the reflective multilayer coating. A layer of material capable of absorbing the incident radiation (in the case of EUV, Au or Ge can be used) is deposited onto the protective layer. A top patterning layer of photoresist is then spun onto the absorber material. A circuit pattern can be produced on the surface of the resist using conventional steppers or e-beam writers. The circuit pattern is etched onto the absorber layer by conventional integrated circuit etching techniques finally, the top photoresist patterning layer is removed by an oxygen stripping etch and the underlying protective layer can typically be patterned by a more aggressive oxygen reactive ion etching (RIE) process.

It has been found in practice, however, that the absorber layer is prone to delaminate from the underlying protective layer, as shown in FIGS. 1a and 1b, particularly during the step of oxygen plasma stripping of the patterning photoresist layer. Furthermore, in the case of polymeric protective layers, outgassing of this underlying protective layer can take place which can cause undesirable bubbles to form in the absorber surface and can also lead to delamination of the absorber layer from the surface of the underlying protective layer. Moreover, the oxygen RIE process can damage the surface of the reflective multilayer coating.

SUMMARY OF THE INVENTION

The present invention provides a novel method for fabricating masks and reticles useful for projection lithography systems generally and is particularly advantageous for EUV lithography.

In the invention disclosed herein an absorber layer is patterned using a conventional pattern and etch process. Following the step of patterning, the entire surface of the remaining top patterning photoresist layer as well as that portion of the protective photoresist layer where the absorber material has been etched away are exposed to UV radiation. The UV-exposed regions of the protective photoresist layer and the top patterning photoresist layer are then removed by solution development, thereby eliminating the need for an oxygen plasma etch and strip and reducing chances for damaging the surface of the substrate or coatings.

By employing the steps of UV exposure and solution development it has been discovered that there is no delamination of either the protective or absorber layers of the mask structure, thereby retaining the integrity of the patterned structure.

DETAILED DESCRIPTION OF THE INVENTION

Figure 1:
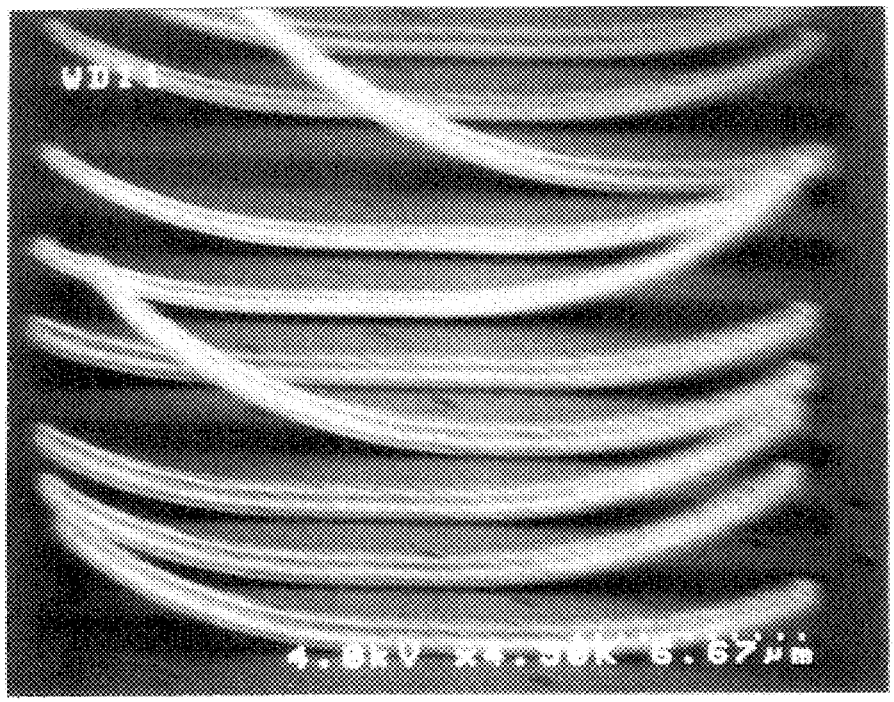
FIG. 1 shows delamination of absorber structures
Figure 2:
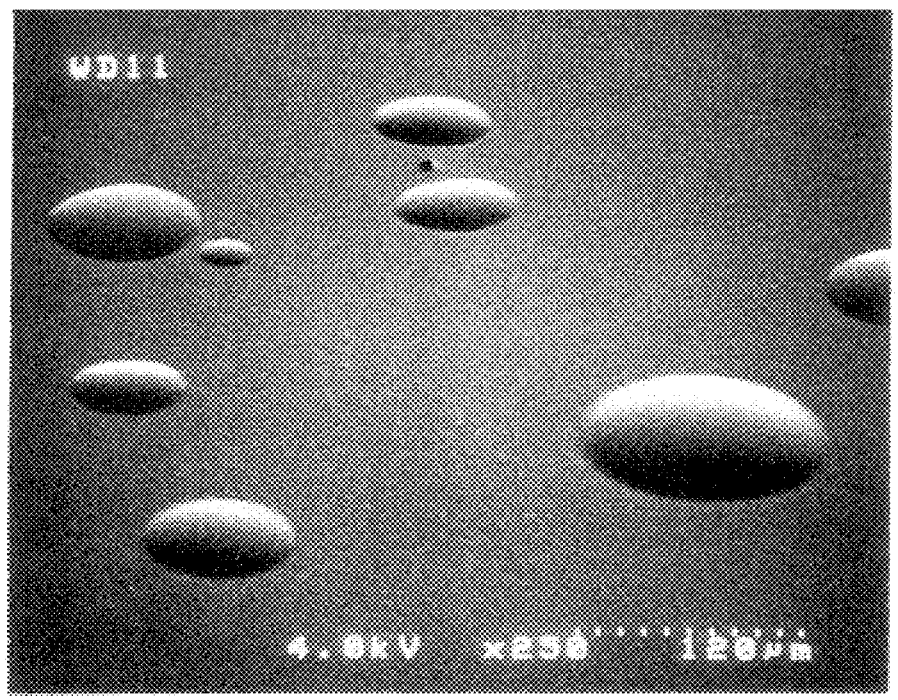
FIG. 2 shows bubbles formed by outgassing protective layer.

As discussed hereinabove and shown in FIGS. 1 and 2, prior art processes for producing mask or reticles suitable for projection lithography have been found to result in delamination of absorber structures and degradation of protective or barrier layers disposed between an absorber layer and the surface of a substrate. The process disclosed herein for producing masks or reticles for projection lithography as well as other lithographic applications such as fabricating micromachines or microelectronic devices has been shown to eliminate these problems. Moreover, by providing for solution developing the present process also eliminates the need for an oxygen plasma etch and stripping of the top patterning photoresist layer and RIE of the protective layer, thereby reducing chances for damage to the absorber layer and the top surface of any multilayer coating by the plasma etch step.

Figure 3:
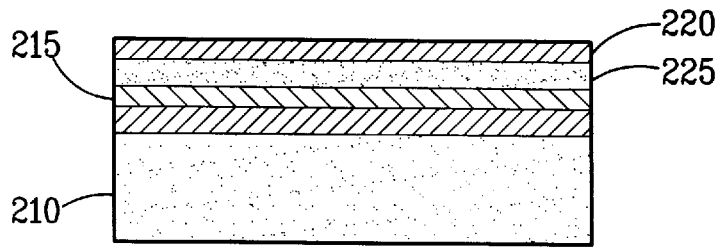
FIGS. 3 to 7 illustrate the steps in one embodiment of the process for forming a pattern on a substrate according to the invention.
Figure 4:
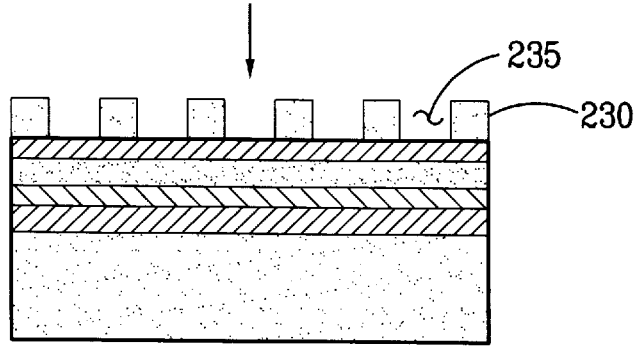

The method of the present invention will be described with reference to FIGS. 3–7. As shown in FIG. 3, a substrate 210 is coated with a protective or barrier layer 225 to a thickness of about 200 nm. Protective layer 225 which can be a polymeric organic material and preferably a photoresist material can also serve as a subsequent defect repair layer. A reflective multilayer coating 215, such as a Mo/Si or Mo/Be multilayer coating, can be disposed between substrate 210 and protective layer 225. Following application of protective layer 225 the protective layer is hard-baked.

Following the step of hard-baking, an absorber layer 220 is deposited onto protective layer 225 by methods well known to those skilled in the art such as electron beam evaporation. It will be appreciated that the absorber material is designed to absorb radiation and thus, for application to EUV lithography must be capable of absorbing radiation in the range of about 13.4 nm such as Au or Ge and preferably Ge. Absorber layer 220 must be thick enough to provide sufficient EUV absorption so that adequate contrast is obtained in the exposed photoresist. For Ge the minimum thickness has been found to be about 50 nm.

As shown in FIG. 3, after the layer of absorbing material has been deposited, absorber layer 220 is coated with a layer of photoresist patterning material 230, typically about 1 $\mu$m thick. Subject to the requirement that the photoresist material possess sufficient resolution and chemical stability to permit transfer of the pattern to absorber layer 220, any suitable photoresist material can be used. The use of multilayer resists is also contemplated.

Now the photoresist patterning material is patterned by methods known to those skilled in the art (FIG. 4), typically by irradiating the surface of the photoresist material by patterned radiation from a mask. After patterning, photoresist patterning layer 230 is subjected to a post-exposure bake step. The conditions of the post-exposure baking step must be chosen such that delamination of the absorber layer is eliminated and generally are specific for each photoresist patterning material.

Figure 5:
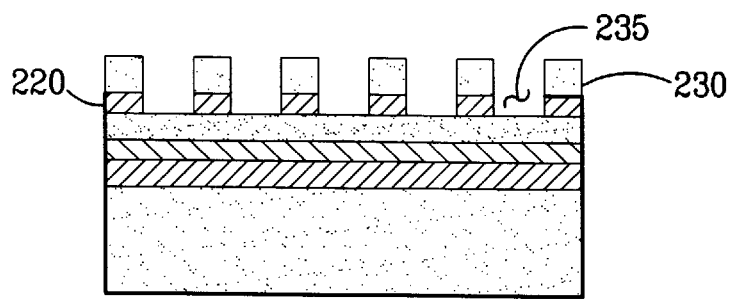

Following the post-exposure bake step, patterning layer 230 is conventionally etched, which can entail chemical development or direct volatilization. The etching process is continued in order to etch away Ge absorber layer 220 in those areas, such as 235, where the Ge absorber has been exposed by removal of patterning layer 230, leaving etch pattern features 235 (FIG. 5). Conventional etching processes can be used, such as wet chemical etching, laser etching or ion milling, however, it is preferred that the patterning layer and the Ge absorber layer are etched by reactive ion etching (RIE) using $CF_3Br$ or a low power oxygen plasma etch.

Figure 6:
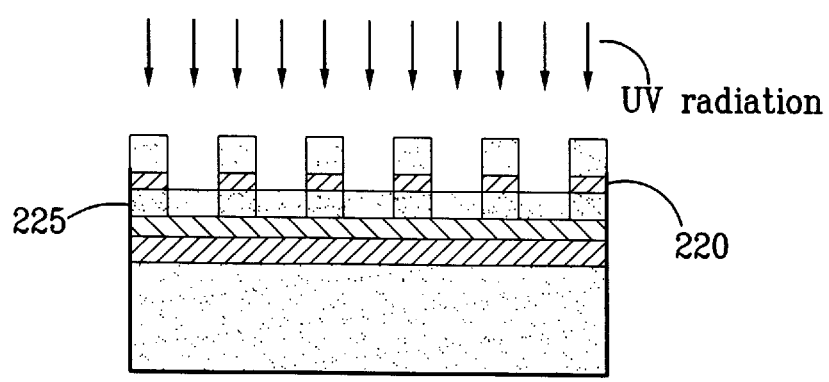
Figure 7:
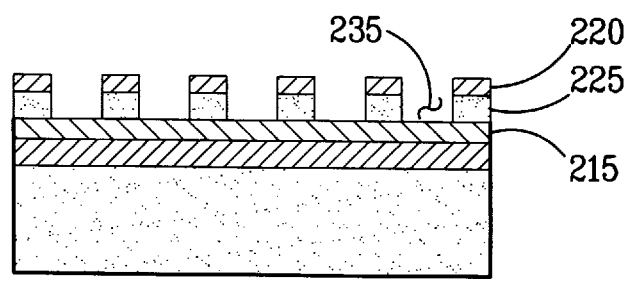

Following etching of absorber layer 220 the entire surface of the patterned substrate is exposed to UV radiation such as a broad-band UV lamp (FIG. 6). It has been observed that absorber layer 220 can act as a direct contact mask to the underlying protective photoresist layer 225. The UV-exposed patterned substrate is then wet solution developed using conventional methods. The result of the wet development step (FIG. 7) is that the top patterning layer 230 as well as the exposed protective photoresist layer in areas such as 235 have both been removed without attacking the underlying reflective multilayer coating layer 215, leaving patterned absorber layer 215 and the underlying protective layer 225 behind.

The present invention now will be described more fully hereinafter by way of example illustrative of the invention. This invention may, however, be embodied in many different forms and should not be construed as limited to the embodiment set forth herein.

EXAMPLE

A 4-inch silicon wafer having a multilayer coating with a peak reflectance at about 13.5 nm was first coated with a protective coating. Here, the protective coating was a spun-on 200 nm thick I-line photoresist (Shipley 1818) diluted with Shipley thinner "Type A" in a ratio of 2.5:1. The silicon wafer was spun at about 4000 rpm and the photoresist hard-baked at 120° C. for about 40 minutes.

Following the hard-bake a Ge EUV absorber layer that was about 50 nm thick was deposited onto the hard-baked protective layer. Deposition of the Ge absorber layer was done using an Ultek® e-beam evaporator operated at an e-beam current of about 40 mA and a deposition pressure of about $10^{-6}$ Torr using a 99.999% pure Ge target. The deposition rate was about 25 nm/min. A patterning layer of OCG 10iR photoresist about 1 $\mu$m thick was spun onto the Ge absorber layer. The patterning layer was patterned with a GCA® I-line stepper having a resolution of about 0.6 $\mu$m.

After the patterning layer had been patterned, it was baked in a post-exposure bake step at a temperature of about 105° C. for about 30 minutes. It has been found that by using these post-exposure baking conditions delamination of the absorber layer can be eliminated. At the conclusion of the post-exposure bake step a mild descum ($0_2$ plasma at 50 W for 30 sec) was done.

The patterning layer and underlying Ge absorber layer were etched in a reactive ion etcher using the following conditions: $CF_3Br$ at 20 sccm, pressure=20 mTorr, power= 100 W (Å250 V DC bias). Under these conditions the etch rate was about 50 nm/min. The Ge absorber layer was overetched by 25%.

After the etching step the surface of the patterned wafer was exposed to UV radiation from a broad band UV lamp. The UV-exposed patterned wafer was solution developed in OCG 4262 developer for 1 minute. It should be noted that this developer was selected because it does not attack either the underlying multilayer coating on the surface of the silicon wafer or the Ge absorber layer while dissolving both the top patterning layer and the exposed protective photoresist layer.

From the foregoing description and examples, one skilled in the art can readily ascertain the essential characteristics of the present invention. The description and examples are intended to be illustrative of the present invention and are not to be construed as limitations or restrictions thereon, the invention being delineated in the following claims.

Sequence Listing

Not applicable.

I claim:

1. A method for fabricating masks for photolithography, comprising the steps of:
    a) patterning an energy sensitive patterning layer disposed on the surface of a structure, wherein the structure includes a substrate, an organic polymeric protective layer, an absorber layer, and an energy sensitive patterning layer;
    b) etching the patterning layer and the underlying absorber layer;
    c) exposing the patterned and etched surface of the patterning layer and the organic protective layer to UV radiation; and
    d) developing the UV exposed surfaces by wet solution developing, thereby removing both the remaining patterning layer as well as that part of the protective layer exposed by etching of the patterning and absorber layers.

2. The method of claim 1, further including a reflective multilayer coating disposed between the top surface of the substrate and the organic polymer protective layer.

3. The method of claim 2, wherein the multilayer coating reflects EUV radiation.

4. The method of claim 1, wherein the absorber layer is Au or Ge.

5. A mask for projection lithography made by the method of claim 1.

6. A method for fabricating reticles for EUV photolithography, comprising the steps of:
    a) patterning an energy sensitive patterning layer disposed on the surface of a structure, wherein the structure includes a multilayer coated silicon wafer substrate, an organic polymeric protective layer, a Ge absorber layer, and an energy sensitive patterning layer;
    b) etching the patterning layer and the underlying absorber layer;
    c) exposing the patterned and etched surfaces of the structure to UV radiation; and
    c) developing the UV exposed surfaces by wet solution developing, thereby removing both the remaining patterning layer as well as that part of the organic polymeric protective layer exposed by etching, of the patterning and absorber layers.

7. The method of claim 6, wherein the multilayer coating consists of alternating layers of materials selected from group Mo, Be and Si.

8. The method of claim 7, wherein the thickness of the Ge absorber layer is about 50 nm thick.

* * * * *